United States Patent [19]

King et al.

[11] 4,065,600

[45] Dec. 27, 1977

[54] METAL OXIDE FILMS

[75] Inventors: Robert David King, Solihull; Robert Hiscutt; Peter Molineux, both of Birmingham, all of England

[73] Assignee: Triplex Safety Glass Company Limited, London, England

[21] Appl. No.: 144,541

[22] Filed: May 18, 1971

[30] Foreign Application Priority Data

May 20, 1970 United Kingdom ............... 24510/70

[51] Int. Cl.$^2$ .............................................. C01C 15/00
[52] U.S. Cl. ................................ 428/432; 204/192 P; 428/539
[58] Field of Search .......................... 204/192, 192 P; 428/432, 539

[56] References Cited

U.S. PATENT DOCUMENTS

| 3,531,335 | 9/1970 | Heyerdahl et al. | 148/174 |
| 3,630,873 | 12/1971 | Moore et al. | 204/192 |
| 3,655,545 | 4/1972 | Gillery et al. | 204/192 |
| 3,907,660 | 9/1975 | Gillery | 204/298 |

FOREIGN PATENT DOCUMENTS 520,592 8/1940 United Kingdom ................. 204/192

*Primary Examiner*—O. R. Vertiz
*Assistant Examiner*—Wayne A. Langel

*Attorney, Agent, or Firm*—Burns, Doane, Swecker & Mathis

[57] ABSTRACT

In a method of depositing a transparent electrically conductive metal oxide coating by reactive sputtering onto the surface of a substrate, the substrate is supported, in spaced relationship with a cathode which is to be sputtered, in a vacuum chamber containing an atmosphere comprising an inert gas and a controlled oxygen concentration at a selected total pressure. The substrate is heated prior to sputtering to a selected elevated temperature, and reactive sputtering is caused by applying a selected negative potential relative to the substrate. The oxygen in the atmosphere is provided and maintained at a selected concentration, and the heating of said substrate is controlled during sputtering to maintain the substrate temperature substantially constant at the selected temperature during substrate heating caused by sputtering. The selected values of the oxygen concentration substrate temperature, vacuum chamber pressure, and cathode potential are so chosen that the deposited coating is haze-free, and its specific electrical resistivity lies at or close to the minimum of the curve which is obtained by plotting specific electrical resistivity against oxygen concentration while maintaining the substrate temperature, vacuum chamber pressure and cathode potential all constant at the selected values. Glass articles with stable, transparent and haze-free coatings having acceptable resistance are produced by the method.

42 Claims, 7 Drawing Figures

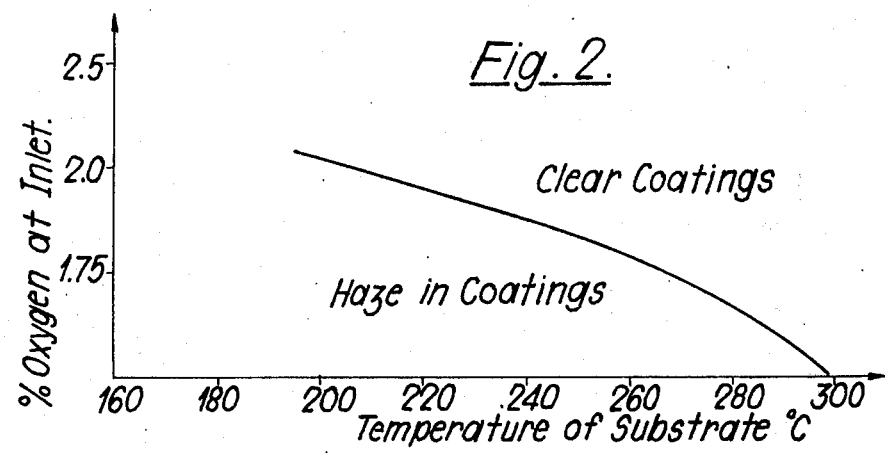
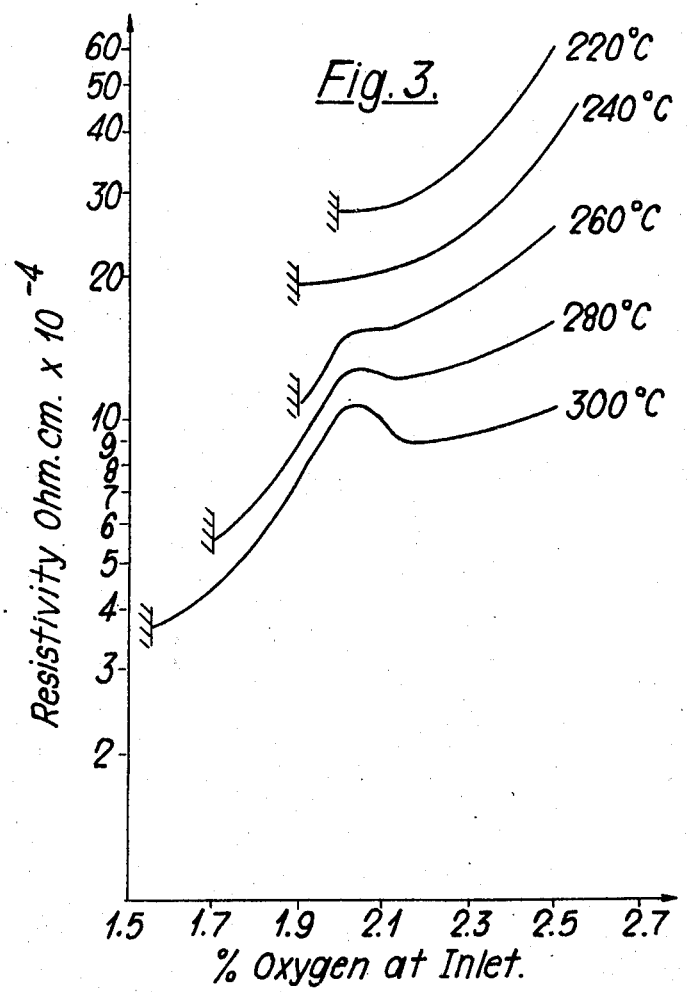

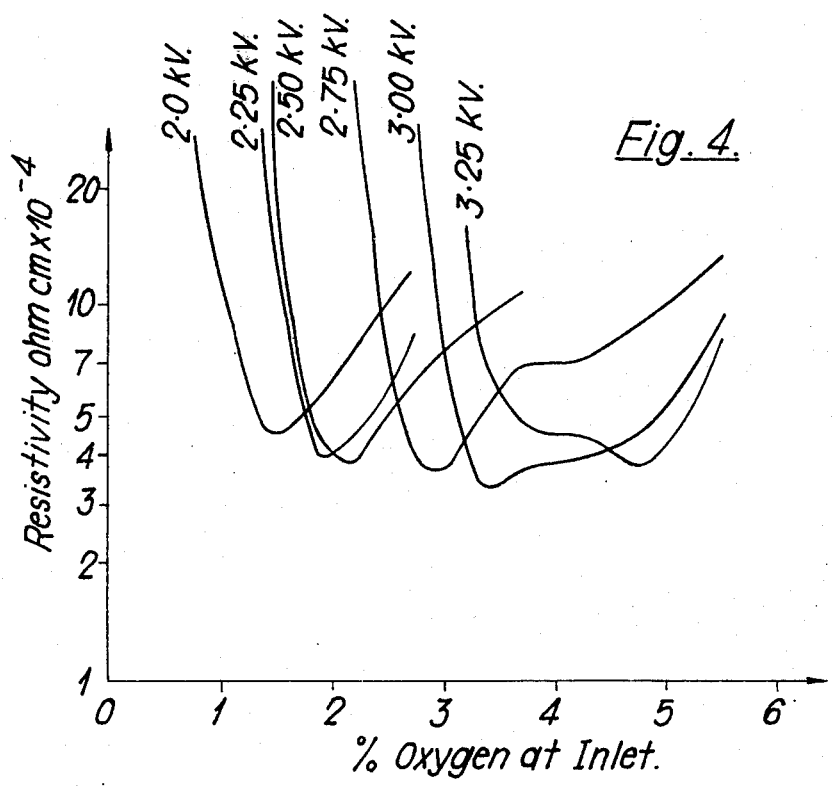
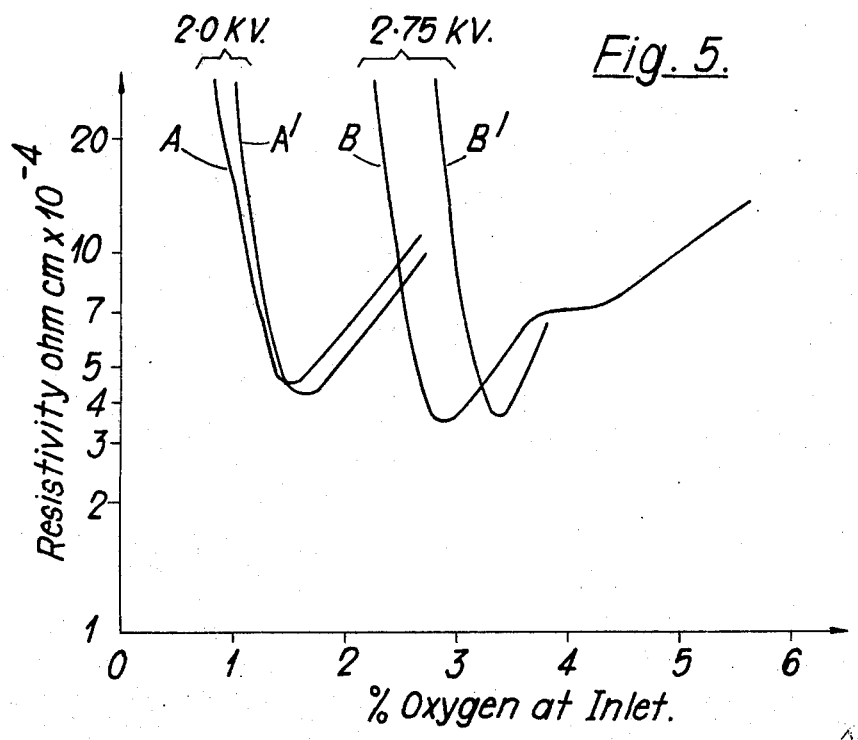

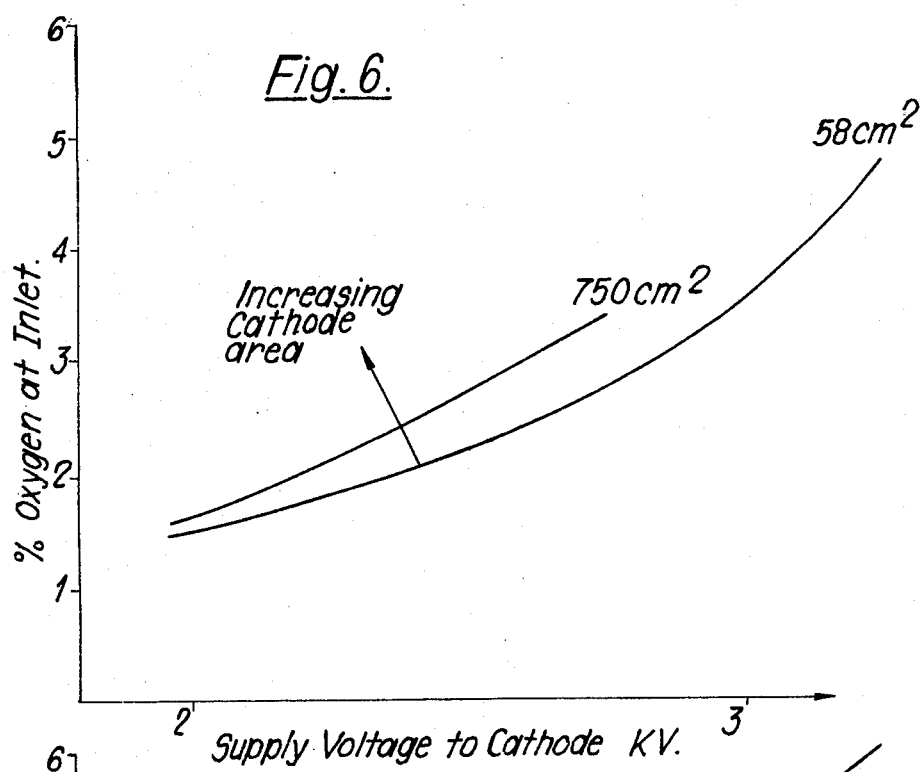
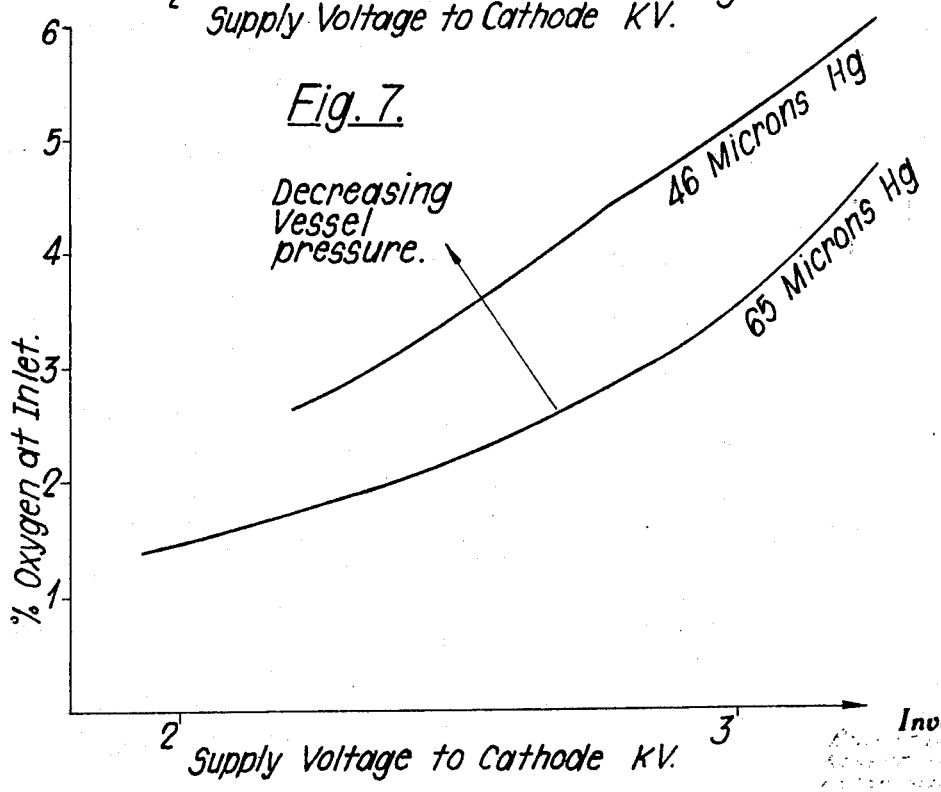

4,065,600

METAL OXIDE FILMS

BACKGROUND OF THE INVENTION

1. Field of the Invention

The invention relates to a method of reactively sputtering a transparent, electrically conductive metal oxide film or coating on a substrate surface, e.g. the surface of a glass sheet.

2. Description of the Prior Art

It is known to produce such coatings on glass substrates but it is constantly desired to be able to produce a coating which has the maximum light transmission and the minimum colour, as well as a resistance to abrasion and a low electrical resistance. In practice, it has been usual to employ a gold coating which has an acceptable light transmission of 70% and a low electrical resistance of 10 ohm/sq., but has a strong yellow colour and a poor resistance to abrasion.

Coatings of a large variety of metal oxides have also been proposed, including indium based alloys, e.g. an indium/tin alloy. One such proposal includes sputtering a substrate in a vacuum chamber having an oxygen containing atmosphere, and subsequently heating the sputtered coating to at least 200° C in a non-oxidising atmosphere to lower its electrical resistance. This proposal thus relates only to a two-stage process which is necessary since the sputtered coating, without being subsequently heated, does not possess a sufficiently low electrical resistance. The quantity of oxygen in the atmosphere of the vaccum chamber is maintained relatively high to obtain an oxide coating with an acceptable light transmission, since before now, whilst it has been known that a reduction of the oxygen content will increase the electrical conductivity of the sputtered coating, it has been believed that such a reduction must essentially be accompanied by the production of substantially a pure metal coating with an unacceptable degree of light transmission. The necessity for post-heating is disadvantageous since it incurs a second operating step and a longer period of time to produce a coating having the desired physical characeteristics. Also the step of post-heating is believed to be detrimental to the stability of the resultant coating, leading to a deterioration, i.e. an increase, of the specific electrical resistivity of the coating.

Another previous proposal avoids the step of post-heating the sputtered film by sputtering the coating in a vacuum chamber having an atmosphere of both oxygen and hydrogen. As before, it has been believed necessary to maintain a relatively high quantity of oxygen. More particularly, it is most undesirable for the atmosphere to contain hydrogen because of the risk of explosion.

Many other proposals have been made for the sputtering of these coatings but none of them are believed to fulfil an object of the invention which is to reactively sputter a metal oxide coating in an atmosphere containing a relatively small amount of oxygen compared with the quantities used before now, whilst obtaining a directly sputtered coating which is transparent, haze-free and has a low specific electrical resistivity which so far as possible remains stable over an extended period of time. Such a process does not require any post-heating step or an atmosphere containing hydrogen.

SUMMARY

According to the invention a method of reactively sputtering a transparent, electrically conductive metal oxide coating on a surface of a substrate supported in a vacuum chamber in spaced relation with a cathode of the metal to be sputtered on the substrate surface, comprises establishing within the vacuum chamber an oxidising atmosphere having a selected oxygen concentration within the range of 1 to 9% by volume present within the spce between the cathode and the substrate surface, whereby the metal oxide coating sputtered within the vacuum chaber is hazefree and has a specific electrical resistivity below $20 \times 10^{-4}$ ohm. cm.

The metal cathode is formed from a metal alloy comprising a base metal having an atomic number between 48 and 52 and another compatible metal, preferably a metal having a valency difference of 1 or 2 with respect to the base metal.

By the term haze-free, it is meant a coating which does not have a hazy appearance and has an acceptably small degree of haze as measured by any standard haze measuring test, for example a test dependent on the percentage of light scattered from a beam of light passed through the coating.

Preferably the atmosphere has a selected oxygen concentration within the range 1 to 6% by volume present within said space between the cathode and the substrate surface.

Preferably the major constituent of said atmosphere is an inert gas. By an inert gas is meant a gas which does not react with other gases or materials in the vacuum chamber to such an extent that during or after sputtering of the coating, the physical properties of the coating deposited on the substrate are substantially affected. Preferably the inert gas is argon.

Preferably the oxygen concentration is selected so that the specific electrical resistivity of the deposited coating lies at or very close to the minimum of the curve which is obtained by plotting specific electrical resistivity against oxygen concentration whilst maintaining all other variables constant.

The metal cathode is advantageously formed from an indium/tin alloy, and may be formed from an indium/tin alloy comprising between 50% and 98% indium and between 2 and 50% tin. More particularly, the cathode may be formed from an indium/tin alloy comprising between 80% and 90% indium and 10 and 20% tin.

The selected potential difference between the cathode and the substrate may be between $-1$ kV and $-5$ kV and preferably between $-2$ kV and $-3.5$ kV.

The selected temperature of the substrate surface may be maintained between 200° and 350° C, and preferably at about 270° to 320° C.

The selected pressure of the vacuum chamber may be between 10 microns Hg and 100 microns Hg, but is preferably between 40 microns Hg and 90 microns Hg.

The invention also includes an article having a transparent and haze-free electrically conductive surface coating applied thereon by a method as described above, the coating having a specific electrical resistivity below $20 \times 10^{-4}$ ohm. cm.

Preferably the coating has a specific electrical resistivity below $10 \times 10^{-4}$ ohm. cm., and may be between $2.5 \times 10^{-4}$ ohm. cm. and $10 - 10^{-4}$ ohm. cm.

BRIEF DESCRIPTION OF THE DRAWINGS

FIG. 2 is a graph of percentage oxygen concentration at the inlet against the temperature of the substrate showing the onset of haze in coatings reactively sputtered by the apparatus shown in FIG. 1;

FIG. 3 is a graph of specific electrical resistivity against oxygen concentration of coatings reactively sputtered at different substrate temperatures;

FIG. 4 is a graph of resistivity against oxygen concentration at various voltages of the cathode supply;

FIG. 5 is a graph of the effect of increasing the area of the cathode;

FIG. 6 is a graph of the optimum oxygen concentrations for use with different sized cathodes at different voltages; and FIG. 7 is a graph of the optimum oxygen concentrations for different pressures in the vacuum vessel.

DESCRIPTION OF THE PREFERRED EMBODIMENTS

Figure 1:
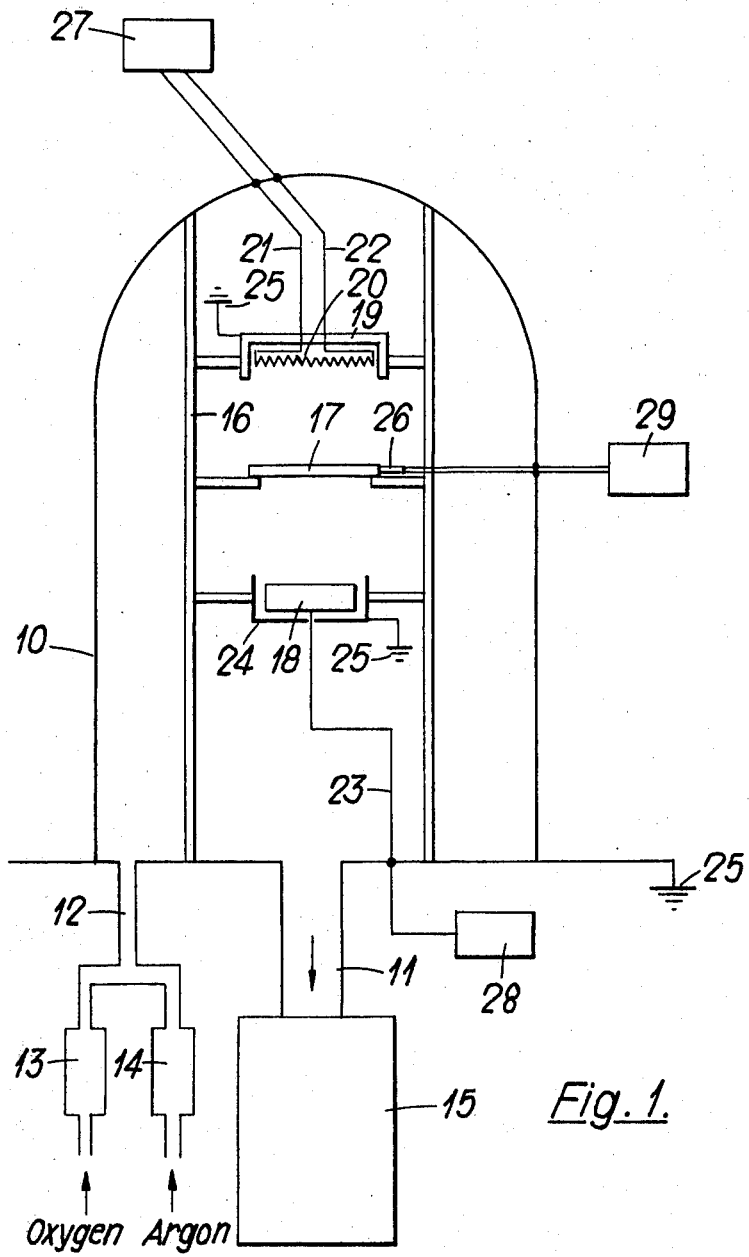
FIG. 1 is a diagrammatic layout, by way of example, of apparatus for depositing a reactively sputtered electrically conductive coating on a substrate surface.

Referring to FIG. 1, there is shown a vacuum chamber or vessel 10 for connection by a conduit 11 to a vacuum pump 15. A further conduit 12 passing through the wall of the vacuum vessel 10 is connected via gas flow meters 13, 14 to separate sources of oxygen and argon respectively. These gas flow meters 13, 14 are provided to ensure accurate control over the rate of flow of the oxygen into the argon and thence into the atmosphere of the vacuum vessel 10. Alternatively, the conduit 12 may be connected to a single source comprising the desired mixture of oxygen and argon.

Within the vacuum vessel 10 there is a framework 16 carrying a substrate 17 which is to be coated on its lower surface with an electrically conductive film by sputtering from a water cooled cathode 18 located beneath the substrate 17 by the framework 16. Serving to heat the substrate 17 is an electric heating element 20 mounted above the substrate within a housing 19, the housing also being carried by the framework 16. The element 20 is connected by leads 21, 22 to an external source 27 of low voltage but high current. The cathode 18 is connected by a lead 23 to an external source 28 of high negative voltage. An electrostatic screen 24 is provided around the sides and underside of the cathode 18, and the screen 24, heated housing 19 and vacuum vessel 10 are each connected to earth 25. This arrangement of the heating element 20 above the substrate 17 and the cathode 18 below is preferred to having the cathode above the substrate and the heating element below, since it avoids the likelihood of damage to the heating element should the substrate, e.g. of glass, be fractured. In addition, any contaminating materials in the vacuum vessel will fall away from the surface of the substrate which is to be coated.

In order to determine and to control the temperature to which the substrate 17 is heated, a thermocouple 26 connected to an external indicating or recording instrument 29, is attached to the edge of the substrate 17 so as to be in thermal contact with it. The thermocouple 26 provides a measure of the lower surface temperature of the substrate 17, as it is heated by the heating element 20.

The instrument 29 preferably includes a controller, for example an electronic controller which is coupled to the source 27 and operates in known manner in response to the signals from the thermocouple 26 to control the application of power to the heating element 20 to maintain the temperature of the substrate in operation within predetermined limits on either side of a selected operating temperature. It has been found desirable, in order to obtain coatings having the most stable resistivity to maintain the temperature of the substrate at worst to within ± 5° C of the selected operating temperature.

As the substrate 17 is exposed to the plasma induced by the electric field existing between the cathode and the substrate 17, the additional power injected by the plasma heats the substrate, and it is consequently necessary to gradually reduce the electric power supplied to the heating element 20, in order to maintain the temperature of the substrate at the required value.

As stated above, a mixture of oxygen and argon is fed into the vacuum vessel 10 through the conduit 12. However, it has been found that only when the size of the cathode 18 is small in relation to the size of the vessel 10, will the oxygen concentration at the inlet 12 be substantially the same as the oxygen concentration in the atmosphere between the cathode 18 and the substrate surface being coated. When the size of the cathode is increased, for example, within the same vessel, it is also necessary to increase the concentration of the oxygen in the atmosphere at the inlet 12 to achieve the desired oxygen concentration within the space between the cathode and the substrate surface. It is the oxygen concentration within the space between the cathode and the substrate surface which is most important since it is this concentration which determines the formation of the desired metal oxide coating, instead of nearer a pure metal coating due to oxygen starvation. Indeed, this concentration is most critical since if it is increased too much, then the resultant coating will have an undesirably high specific electrical resistivity.

In the examples which are given below several different sizes of cathode 18 have been employed in the same sized vacuum vessel 10. The smallest cathode measures 15.2 cm × 3.8 cm and for this cathode it is believed that the oxygen concentration at the inlet 12 is very close to, and, for practical purposes, may be considered to be the same as the actual oxygen concentration within the space between the cathode and the substrate surface. This is because the oxygen molecular usage rate is low compared to the total oxygen molecular throughput. Under these conditions, only a very slight oxygen diffusion gradient will exist between the atmosphere inlet 12 and the vicinity of the cathode 18 and the substrate 17. However, when the area of the cathode is considerably increased, then the oxygen molecular usage rate is likewise increased, and consequently the oxygen diffusion gradient between the inlet 12 and the cathode 18 becomes appreciable. It therefore follows that the greater the diffusion gradient, the higher must be the oxygen concentration at the inlet 12 to maintain a given oxygen concentration within the space between the cathode and the substrate.

Similar conditions apply to the gas flow rate. If the gas flow rate is reduced then the relative oxygen molecular usage rate at the cathode is increased, and consequently the diffusion gradient is correspondingly increased. Thus, as before, the oxygen concentration at the inlet 12 must be increased to compensate for the increased diffusion gradient.

In each example given below, only the measured oxygen concentration at the inlet 12 is given. However, in addition, graphs are described and illustrated (FIGS. 5 and 6) which clearly indicate the required increase in the oxygen concentration when employing the largest cathode of the examples, i.e. a cathode having an area of 750 cm$^2$, to achieve coatings having the same specific electrical resistivity.

An example will now be given describing the method of using the vacuum chamber shown in FIG. 1.

A specimen of toughened soda-lime-silica glass substrate 17 of dimensions 38 mm square and 4 mm thick was positioned on the framework 16 in the vacuum vessel 10. The vacuum vessel 10 was then evacuated to a pressure of 0.05 microns Hg as measured on a Penning vacuum pressure gauge, and electric power was applied to the heating element 20 through the leads 21, 22, the substrate below being heated to a temperature of 280° C. Oxygen gas was then admitted to the vacuum vessel 10 through the gas flow meter 13 at a flow rate of 6 cc/min. and argon gas through the gas flow meter 14 at flow rate of 294 cc/min. This flow of gas resulted in a combined flow rate of 300 cc/min. of gas having a concentration of about 2.0% oxygen by volume of the atmosphere in the vacuum vessel 10 and produced an increase in the pressure in the vessel to 90 microns Hg as measured on a MacLeod vacuum pressure gauge.

The cathode 18 was flat and measured 46 cm long by 3.8 cm wide (area of 175 cm$^2$). On its upper side was cast a block of indium/tin alloy having a composition of 80% indium and 20% tin. The distance between the adjacent surfaces of the cathode 18 and the glass substrate 17 was 30 mm, and a voltage of $-2$ kV and a current of 130 mA was applied to the cathode. The power applied to the heating element 20 was gradually reduced in order to maintain the glass substrate 17 at a substantially constant temperature of about 280° C and at any rate to within $\pm$ 5° C of that temperature. This was necessary owing to the heating effect produced by ionic bombardment from the glow discharge between the cathode and the substrate.

The ionized argon ions bombard the surface of the cathode 18 thus removing metal from the cathode and thereby sputtering reactively a coating of indium/tin oxide on to the lower surface of the glass substrate 17, the oxygen content of the sputtered coating being regulated by the concentration of oxygen, in this example about 2%, in the atmosphere within the vacuum vessel 10. The power supplied to the cathode 18 and the heating element 20 were then removed, the gas flows turned off and the glass substrate allowed to cool.

The coated glass substrate was then removed from the vessel and found to have a resistance of 82.5 ohm/sq. The coating was neutral in colour when viewed in transmitted white light, and had a measured light transmission of about 82%.

The colour of the coating when viewed by reflected light was pale brown, giving an estimated thickness to the coating of about 1,000 Å, and a calculated specific electrical resistivity for the coating of $8.25 \times 10^{-4}$ ohm.cm. Also the coating has a hypothetical time (TLO) of 66 minutes which is the calculated time to sputter a film with a resistance of 10 ohm/sq. This time is of significance, in practice, in the rapid production of coated substrates of a required electrical resistance, as it gives a measure of the time required to complete each deposition.

The coating possessed a degree of haze measuring less than 1%, according to the United States Standard ASTM D 1003 59T.

This example is the first of several examples of coatings formed in the same manner and summarised in the Table given at the end of this specification.

In accordance with this invention there is deposited on a substrate surface a reactively sputtered coating which is transparent and haze-free, and which has a specific electrical resistivity of below $20 \times 10^{-4}$ ohm.cm.

The coating deposited in the above described examples meets these requirements. Moreover, the coating achieves the desired value of specific electrical resistivity without the need for post-heating the sputtered coating or the inclusion of hydrogen or other reactive gases in the sputtering atmosphere. Coatings sputtered in the above described manner on glass substrates have been laminated with other glass sheets and then tested for 1000 hours at 70° C. At the end of the tests it was found that the lower the specific electrical resistivity of the coating, the more stable was the resistivity of the coating with time and some specimens were found to be stable to as little as $\pm$ 2%. Moreover, it was found that specimens sputtered with higher resistivities and then heated to achieve the lower resistivities were not as stable as coatings directly sputtered with the lower resistivities in accordance with this invention.

Experiments have also shown that the specific electrical resistivity of the deposited coating may be varied by varying, for example, the pressure in the vacuum vessel, the potential difference between the cathode and the substrate, the temperature of the substrate surface to be coated, the concentration of oxygen in the atmosphere in the vacuum vessel and the composition of the cathode.

It is desirable that the selected values of these parameters should result in a high rate of deposition of the oxide coating and thus lessen the time of deposition. It has also been found that employment of a relatively higher voltage supply to the cathode within the preferred range of $-1.0$ kV to $-5.0$ kV or a lower pressure in the vacuum chamber will allow a higher proportion of oxygen to be admitted, whilst still obtaining a haze-free coating having a specific electrical resistivity below $20 \times 10^{-4}$ ohm. cm.

It was further found, by experiment, that within the desired temperature range for the substrate, the higher the temperature of the substrate during deposition of the coating, the lower is the specific electrical resistivity of the resultant coating. Below a critical temperature the coating becomes hazy in appearance and thus not satisfactory, and the dependence of this critical temperature on the percentage concentration of oxygen in the atmosphere of the vacuum vessel 10 is shown in FIG. 2, the figures being applicable to reactively sputtering coatings on sheets of glass at various temperatures from a cathode at $-2$ kV and having a composition of 87.5% indium and 12.5% tin oxide and in an atmosphere of argon/oxygen mixture at a pressure of 90 microns Hg. However, temperatures greatly in excess of 300° C are undesirable when toughened glass substrates are being coated, in order to avoid detoughening of the glass. In other cases, temperatures in excess of 300° C may be used, sputtering at such higher temperatures resulting in lower values of specific electrical resistivity when using a given quantity of oxygen in the argon/oxygen atmosphere.

Similar graphical paths are produced on sputtering other indium/tin oxides, but resulting in slightly different minimum values of specific electrical resistivity, for the same percentages of oxygen in the argon/oxygen atmosphere and for the same temperatures of the substrate.

The specific electrical resistivity of the resultant coating is also altered by the concentration of oxygen maintained in the atmosphere of the vacuum vessel 10, all other parameters remaining constant. This characteristic is clearly shown in FIG. 3, where specific electrical resistivity is plotted against oxygen percentage by volume in the atmosphere at the inlet of the vessel, the figures being applicable to reactively sputtering with a cathode composed of 87.5% indium and 12.5% tin to give oxide coatings on sheets of glass at various temperatures from a cathode at −2 kV and in an atmosphere of argon/oxygen mixture at a pressure of 90 microns Hg. As can be seen from FIG. 3, the value of the specific electrical resistivity is at a minimum value for certain oxygen concentrations before the coating becomes hazy. For example, if the substrate temperature is 300° C and the oxygen concentration is less than 1.6%, then it was found that the resultant coating is hazy. Since it is desirable to produce a coating which is both clear and has a specific electrical resistivity below $10 \times 10^{-4}$ ohm. cm, it is preferred, for the conditions related to FIGS. 2 and 3, that the oxygen content is between 1.6 to 1.9% by volume of the atmosphere and the temperature of the substrate surface is between 280° and 300° C, the oxygen percentage and temperature of the substrate surface being selected to avoid haze. However, both lower and higher values of specific electrical resistivity are obtainable using different percentages of oxygen and different temperatures of the substrate surface, as is readily appreciated from FIG. 3. Hence, in accordance with the invention the oxygen content may be varied between 1 to 9% by volume of the argon/oxygen atmosphere.

Similarly the other parameters of the sputtering method described above may be varied, and the following ranges are given by way of example:

| | |
|---|---|
| Temperature of substrate surface | 200° C to 350° C |
| Potential difference between cathode and substrate | −1 kV to −5 kV |
| Composition of cathode | 98% to 50% indium and 2% to 50% tin, by weight |
| Pressure of the vacuum chamber | 10 microns Hg to 100 microns Hg |
| Distance between cathode and substrate | 20 mm to 100 mm. |

More particularly, FIG. 4 shows a graph of the resistivity of the resultant coating against oxygen concentration of the atmosphere at the inlet of the vessel, at various voltages of the supply to the cathode between −2 kV and −3.25 kV as indicated. These figures correspond to the use of a cathode having a surface area of 58 cm² and a composition of 80% indium and 20% tin. The cathode is spaced 38 mm from a substrate maintained at 300° C, and the pressure in the vacuum vessel is 65 microns Hg. For the purposes of achieving an acceptable coating which is as stable as possible, the resistivity should be as low as possible. It will be seen from FIG. 4 that by increasing the voltage, the minima of resistivity are achieved with increasing oxygen concentrations. In practice, it has been found desirable to obtain a high rate of deposition by selecting an operating potential which is as high as the consequent practical problems such as arcing permit, and then to select the oxygen concentration, having fixed the other parameters at selected values, so as to obtain a low specific electrical resistivity. It is believed that coatings deposited under conditions corresponding to the minima of the curves shown in FIG. 4 are believed to be the most stable.

The above description has referred to the effect achieved simply by using different sized cathodes. FIG. 5 gives examples of this effect with regard to the voltage curves shown in FIG. 4 representing −2 kV and −2.75 kV. In each case, the left curve referenced A;B applying to the use of a small cathode having a surface area of 58 cm² and the right curve reference A';B' applying to the use of a large cathode having a surface area of 750 cm², the vessel being of the same size in both cases. It will be seen that the increase in size of the cathode necessitates the provision of a higher oxygen concentration at the inlet conduit 12 in order to achieve the minima resistivity. This optimum oxygen concentration is shown in FIG. 6 where the upper curve represents use of the large cathode and the lower curve represents use of the small cathode.

FIG. 7 is another graph of oxygen concentration against voltage supply to the cathode and illustrating the optimum oxygen concentration for different pressures in the vacuum vessel. The pressures shown are 46 and 65 microns Hg and it will be seen that at the lower pressure (i.e. the upper curve) greater oxygen concentrations are required to achieve the lowest resistivities. Both curves apply to the use of a cathode of 58 cm² surface area and having a composition of 80% indium and 20% tin. The cathode is spaced 38 mm from a substrate maintained at 300° C.

Although glass substrates are referred to above, in practice coatings may also be deposited on other suitable materials such as porcelain, silica or mica.

An advantage of the indium/tin oxide coatings specified above is that they can be deposited to give an acceptably low electrical resistance, preferably between about 2 ohm/sq. and 100 ohm/sq., and, as compared with gold coatings, to give a greater light transmission, a more neutral colour, and an increase in hardness with a consequent greater resistance to abrasion.

If desired a substrate may be coated with an electrically conductive coating other than an indium/tin alloy from an appropriately selected cathode. For example, the cathode may comprise an indium/germanium, or indium/phosphorus, or indium/tellurium alloy.

Also, instead of introducing the required concentration of oxygen into the atmosphere of the vacuum vessel 10 by admitting pure oxygen with the argon or a premixed argon/oxygen gas supply, the oxygen concentration may be provided and maintained by supplying the vessel with a selected amount of gaseous oxide which liberates the necessary amount of oxygen in the atmosphere of the vessel, for example carbon monoxide (CO) or carbon dioxde ($CO_2$).

The following Table gives details of a number of specific coatings in accordance with the invention when achieved by the process described above:

| TABLE OF EXAMPLES | | | | | | | |
|---|---|---|---|---|---|---|---|
| Example No. | 1 | 2 | 3 | 4 | 5 | 6 | 7 |
| Dimensions of substrate (mm × mm) | 38 × 38 | 38 × 38 | 38 × 38 | 38 × 38 | 38 × 38 | 38 × 38 | 40 × 25 |
| Composition of Cathode, % tin, the remainder indium | 20 | 12.5 | 20 | 12.5 | 20 | 20 | 12 |
| Pressure in vessel | | | | | | | |

-continued

TABLE OF EXAMPLES

| | | | | | | | |
|---|---|---|---|---|---|---|---|
| (microns Hg) | 90 | 90 | 90 | 90 | 70 | 70 | 65 |
| Voltage Supply to Cathode (kV) | 2 | 2 | 2 | 2 | 2.5 | 2.5 | 4.7 |
| Current Supply to Cathode (mA) | 130 | 400 | 110 | 450 | 100 | 100 | 75 |
| Distance between cathode & substrate (mm) | 30 | 25 | 30 | 25 | 30 | 30 | 38 |
| Cathode area (cm$^2$) | 175 | 690 | 175 | 690 | 175 | 175 | 64 |
| Vacuum vessel volume (m$^3$) | 0.365 | 0.365 | 0.365 | 0.365 | 0.365 | 0.365 | 0.41 |
| O$_2$ flow rate (cc/min) | 6 | 6 | 6.6 | 5.5 | 11.5 | 13.8 | 34 |
| % O$_2$ in atmosphere at inlet, the remainder argon | 2 | 1.9 | 2 | 1.75 | 4 | 5.3 | 8.5 |
| Temperature of substrate (° C) | 280 | 285 | 300 | 280 | 270 | 270 | 300 |
| Sputtering time (min) | 8 | 10 | 20 | 10 | 10 | 10 | 5 |
| % Light transmission of coating | 82 | 85 | 85 | 84 | 83 | 85 | 85 |
| Thickness of coating (A) | 1000 | 2000 | 2500 | 2700 | 2400 | 2400 | 2500 |
| Resistance of coating (ohm/sq) | 82.5 | 45 | 19.5 | 20.7 | 18 | 31.5 | 12 |
| Specific Resistivity (ohm.cm × 10$^{-4}$) | 8.25 | 9 | 4.87 | 5.6 | 4.3 | 7.7 | 3 |
| T10-time to sputter 10 ohm/sq. (min) | 66 | 45 | 39 | 21 | 18 | 32 | 6 |
| Example No. | 8 | 9 | 10 | 11 | 12 | 13 | 14 |
| Dimensions of substrate (mm × mm) | 40 × 25 | 40 × 25 | 40 × 25 | 40 × 25 | 40 × 25 | 40 × 25 | 40 × 25 |
| Composition of Cathode, % tin, the remainder indium | 2 | 4 | 6 | 12 | 18 | 24 | 20 |
| Pressure in vessel (microns Hg) | 65 | 65 | 65 | 65 | 65 | 65 | 65 |
| Voltage Supply to Cathode (kV) | 3.2 | 3.2 | 3.2 | 3.2 | 3.2 | 2.4 | 2 |
| Current Supply to Cathode (mA) | 40 | 40 | 45 | 45 | 40 | 25 | 18 |
| Distance between cathode & substrate (mm) | 38 | 38 | 38 | 38 | 38 | 38 | 38 |
| Cathode area (cm$^2$) | 58 | 58 | 58 | 58 | 58 | 58 | 58 |
| Vacuum vessel volume (m$^3$) | 0.41 | 0.41 | 0.41 | 0.41 | 0.41 | 0.41 | 0.365 |
| O$_2$ flow rate (cc/min) | 8 | 12 | 12 | 12 | 16 | 12 | 4.5 |
| % O$_2$ in atmosphere at inlet, the remainder argon | 2 | 3 | 3 | 3 | 4 | 3 | 1.3 |
| Temperature of substrate (° C) | 300 | 300 | 300 | 300 | 300 | 300 | 300 |
| Sputtering time (min) | 10 | 10 | 10 | 10 | 10 | 10 | 10 |
| % Light transmission of coating | 86 | 84 | 84 | 83 | 80 | 85 | 86 |
| Thickness of coating (A) | 4000 | 3900 | 3700 | 3600 | 3400 | 1700 | 1100 |
| Resistance of coating (ohm/sq) | 25 | 41 | 32 | 7.2 | 13.5 | 42 | 48 |
| Specific Resistivity (ohm.cm × 10$^{-4}$) | 10 | 16 | 11.8 | 2.6 | 4.6 | 7.1 | 5.3 |
| T10-time to sputter 10 ohm/sq. (min) | 25 | 41 | 32 | 7 | 14 | 42 | 49 |
| Example No. | 15 | 16 | 17 | 18 | 19 | 20 | 21 |
| Dimensions of substrate (mm × mm) | 40 × 25 | 40 × 25 | 40 × 25 | 40 × 25 | 40 × 25 | 40 × 25 | 40 × 25 |
| Composition of Cathode, % tin, the remainder indium | 20 | 20 | 20 | 20 | 20 | 20 | 20 |
| Pressure in vessel (microns Hg) | 65 | 65 | 65 | 65 | 46 | 46 | 36 |
| Voltage Supply to Cathode (kV) | 2.75 | 2.75 | 3 | 3.25 | 2.75 | 3.25 | 3.25 |
| Current Supply to Cathode (mA) | 37 | 38 | 43 | 48 | 13 | 23 | 15 |
| Distance between cathode & substrate (mm) | 38 | 38 | 38 | 38 | 38 | 38 | 38 |
| Cathode area (cm$^2$) | 58 | 58 | 58 | 58 | 58 | 58 | 58 |
| Vacuum vessel volume (m$^3$) | 0.365 | 0.365 | 0.365 | 0.365 | 0.365 | 0.365 | 0.365 |
| O$_2$ flow rate (cc/min) | 15.6 | 17.6 | 15 | 12.2 | 17.3 | 20 | 25 |
| % O$_2$ in atmosphere at inlet, the remainder argon | 4.8 | 5.5 | 4.3 | 3.7 | 5.5 | 6.8 | 8.5 |
| Temperature of substrate (° C) | 310 | 312 | 320 | 320 | 305 | 305 | 300 |
| Sputtering time | | | | | | | |

-continued

TABLE OF EXAMPLES

| | | | | | | | |
|---|---|---|---|---|---|---|---|
| (min) | 5 | 8 | 5 | 3 | 15 | 10 | 10 |
| % Light transmission of coating | 89.5 | 80 | 82 | 87 | 90.5 | 82 | 90 |
| Thickness of coating (A) | 1250 | 1850 | 1900 | 1300 | 1600 | 2050 | 1500 |
| Resistance of coating (ohm/sq) | 70 | 70 | 20.5 | 38 | 48 | 32 | 47 |
| Specific Resistivity (ohm.cm × $10^{-4}$) | 8.8 | 12.9 | 3.9 | 4.9 | 7.7 | 6.6 | 7 |
| T10-time to sputter 10 ohm/sq. (min) | 35 | 56 | 10 | 11.4 | 72 | 32 | 47 |
| Example No. | 22 | 23 | 24 | 25 | 26 | 27 | |
| Dimensions of substrate (mm × mm) | 40 × 25 | 40 × 25 | 40 × 25 | 40 × 25 | 40 × 25 | 40 × 25 | |
| Composition of Cathode, % tin, the remainder indium | 20 | 20 | 20 | 20 | 12.5 | 12.5 | |
| Pressure in vessel (microns Hg) | 90 | 46 | 65 | 65 | 90 | 90 | |
| Voltage Supply to Cathode (kV) | 2.5 | 2.75 | 2 | 2.75 | 2 | 2 | |
| Current Supply to Cathode (mA) | 37 | 14 | 18 | 38 | 450 | 450 | |
| Distance between cathode & substrate (mm) | 20 | 45 | 38 | 38 | 25 | 25 | |
| Cathode area (cm$^2$) | 58 | 58 | 750 | 750 | 690 | 690 | |
| Vacuum vessel volume (m$^3$) | 0.365 | 0.365 | 0.365 | 0.365 | 0.365 | 0.365 | |
| O$_2$ flow rate (cc/min) | 14.8 | 15.4 | 4.4 | 12.1 | 3.1 | 3.1 | |
| % O$_2$ in atmosphere at inlet, the remainder argon | 3.8 | 4.8 | 1.3 | 3.6 | 2.25 | 2.25 | |
| Temperature of substrate (° C) | 304 | 302 | 300 | 302 | 250 | 205 | |
| Sputtering time (min) | 5 | 15 | 10 | 5 | 10 | 10 | |
| % Light transmission of coating | 80 | 87 | 86.5 | 89 | 84 | 85 | |
| Thickness of coating (A) | 1600 | 1300 | 1200 | 1450 | 2200 | 3400 | |
| Resistance of coating (ohm.sq) | 25 | 48 | 52 | 32 | 51 | 51 | |
| Specific Resistivity (ohm.cm × $10^{-4}$) | 4 | 6.2 | 6.3 | 4.7 | 11.2 | 17.3 | |
| T10-time to sputter 10 ohm.sq (min) | 12.5 | 42 | 52 | 16 | 51 | 51 | |

We claim:

1. A method of depositing a transparent electrically conductive metal oxide coating by reactive sputtering onto the surface of a substrate, wherein: the substrate is supported, in spaced relationship with a cathode which is to be sputtered, in a vacuum chamber containing an atmosphere comprising an inert gas and a controlled oxygen concentration at a selected reduced total pressure, the substrate is heated prior to sputtering to a selected elevated temperature, and reactive sputtering is caused by applying a selected negative potential to the cathode relative to the substrate, the oxygen in the atmosphere being provided and maintained at a selected concentration, and the heating of said substrate being controlled during sputtering to maintain said substrate temperature substantially constant at said selected temperature during heating of said substrate caused by sputtering, the selected values of the oxygen concentration, substrate temperature, vacuum chamber pressure, and cathode potential being so chosen that the deposited coating is haze-free, and its specific electrical resistivity lies at or close to the minimum of the curve which is obtained by plotting specific electrical resistivity against oxygen concentration while maintaining the substrate temperature, vacuum chamber pressure and cathode potential all constant at said selected values.

2. The method according to claim 1 wherein the substrate is a sheet of soda-lime-silica glass.

3. The method according to claim 2 wherein the glass is toughened before having said coating sputtered therein.

4. The method of claim 1 wherein the cathode is an alloy of a base metal having an atomic number of from 48 to 52 and another compatible metal.

5. The method of claim 1 wherein the cathode is an alloy of a base metal having an atomic number of from 48 to 52 and another compatible metal having a valency difference of 1 or 2 with respect to the base metal.

6. The method of claim 1 wherein the cathode is an indium/tin alloy comprising between 50 and 98% indium and between 2 and 50% tin.

7. The method of claim 1 wherein the cathode is an indium/tin alloy comprising between 80 and 90% indium and between 10 and 20% tin.

8. The method according to claim 1 wherein the cathode is formed from an alloy selected from indium/tin, indium/germanium, indium/phosphorus, and indium/tellurium.

9. The method of claim 1 wherein the potential difference between the cathode and the substrate is in the range of from −1kV to −5kV.

10. The method of claim 1 wherein the potential difference between the cathode and the substrate is in the range of from −2kV to −3.5kV.

11. The method of claim 1 wherein said selected temperature of said substrate is in the range of from 200° to 350° C.

12. The method of claim 1 wherein said selected temperature of said substrate is in the range of from 270° to 320° C.

13. The method of claim 1 wherein said selected value of oxygen concentration is in the range of from 1 to 9% by volume present within the space between the cathode and the substrate surface.

14. The method of claim 1 wherein said selected value of oxygen concentration is in the range of from 1 to 6% by volume present within the space between the cathode and the substrate surface.

15. The method of claim 1 wherein said selected value of oxygen concentration is in the range of from 1.6 to 1.9% by volume and said selected temperature of said substrate is in the range of from 280° and 300° C.

16. The method of claim 1 wherein said selected vacuum chamber pressure is in the range of from 10 microns Hg to 100 microns Hg.

17. The method of claim 1 wherein said selected vacuum chamber pressure is from 40 microns Hg to 90 microns Hg.

18. The method according to claim 1 wherein the substrate is a refractory os siliceous material.

19. The method according to claim 1 wherein the substrate is selected from porcelain, silica and mica.

20. An article with a transparent and haze-free, electrically conductive metal oxide coating having a specific electrical resistivity below $10 \times 10^{-4}$ ohm.cm. applied thereon by a process according to claim 1.

21. An article according to claim 20 wherein the coating has a specific electrical resistivity between $2.5 \times 10^{-4}$ ohm. cm. and $10 \times 10^{-4}$ ohm.cm.

22. An article with a transparent and haze-free, electrically conductive metal oxide coating having a specific electrical resistivity below $20 \times 10^{-4}$ ohm. cm. applied thereon by a process according to claim 1.

23. A glass article with a stable, transparent and haze-free, electrically conductive coating having a resistance in the range of from 2 ohm/sq. to 100 ohm/sq. applied thereon by a process according to claim 1.

24. A method of depositing a transparent electrically conductive metal oxide coating onto the surface of a glass substrate by reactive sputtering, the process comprising the following steps:
supporting the substrate in a chamber in spaced relationship with a cathode of an alloy which is to be sputtered,
evacuating the chamber,
heating the surface of the substrate to a selected temperature in the range of from 200° to 350° C before commencing sputtering,
providing an atmosphere in the chamber comprising an inert gas and a controlled oxygen concentration and maintaining the pressure of the atmosphere in the chamber at a selected value of from 10 to 100 microns Hg,
maintaining the oxygen in the space between the cathode and the substrate at a selected oxygen concentration within the range of 1 to 9% by volume,
causing deposition of a metal oxide film on the substrate by reactive sputtering by applying a negative potential to the cathode selected such that the potential difference between cathode and substrate is in the range of from $-1$kV to $-5$kV, and
controlling the heating of the surface of the substrate during sputtering to maintain the substrate temperature substantially constant at said selected temperature,
the selected values of the oxygen concentration, substrate temperature, vacuum chamber pressure, and cathode potential being so chosen that the deposited coating is haze-free, and its specific electrical resistivity lies at or close to the minimum of the curve which is obtained by plotting specific electrical resistivity against oxygen concentration while maintaining the substrate temperature, vacuum chamber pressure and cathode potential all constant at said selected values.

25. The method according to claim 24 wherein the substrate is a sheet of soda-lime-silica glass.

26. The method according to claim 25 wherein the glass is toughened before having said coating sputtered therein.

27. The method of claim 24 wherein the cathode is an alloy of a base metal having an atomic number of from 48 to 52 and another compatible metal.

28. The method of claim 24 wherein the cathode is an alloy of a base metal having an atomic number of from 48 to 52 and another compatible metal having a valency difference of 1 or 2 with respect to the base metal.

29. The method of claim 24 wherein the cathode is an indium/tin alloy comprising between 50 and 98% indium and between 2 and 50% tin.

30. The method of claim 24 wherein the cathode is an indium/tin alloy comprising between 80 and 90% indium and between 10 and 20% tin.

31. The method according to claim 24 wherein the cathode is formed from an alloy selected from indium/tin, indium/germanium, indium/phosphorus, and indium/tellurium.

32. The method of claim 24 wherein the potential difference between the cathode and the substrate is in the range of from $-2$kV to $-3.5$kV.

33. The method of claim 24 wherein said selected temperature of said substrate is in the range of from 270° to 320° C.

34. The method of claim 24 wherein said selected value of oxygen concentration is in the range of from 1 to 6% by volume present within the space between the cathode and the substrate surface.

35. The method of claim 24 wherein said selected value of oxygen concentration is in the range of from 1.6 to 1.9% by volume and said selected temperature of said substrate is in the range of from 280° and 300° C.

36. The method of claim 24 wherein said selected vacuum chamber pressure is from 40 microns Hg to 90 microns Hg.

37. The method according to claim 24 wherein the substrate is a refractory or siliceous material.

38. The method according to claim 24 wherein the substrate is selected from porcelain, silica and mica.

39. A glass article with a transparent and haze-free, electrically conductive metal oxide coating having a specific electrical resistivity below $10 \times 10^{-4}$ ohm. cm. applied thereon by a process according to claim 24.

40. A glass article according to claim 39 wherein the coating has a specific electrical resistivity between $2.5 \times 10^{-4}$ ohm. cm. and $10 \times 10^{-4}$ ohm.cm.

41. A glass article with a transparent and haze-free, electrically conductive metal oxide coating having a specific electrical resistivity below $20 \times 10^{-4}$ ohm. cm. applied thereon by a process according to claim 24.

42. A glass article with a stable, transparent and haze-free, electrically conductive coating having a resistance in the range of from 2 ohm/sq. to 100 ohm/sq. applied thereon by a process according to claim 24.

* * * * *